United States Patent [19]
Sakaguchi et al.

[11] Patent Number: 5,080,980
[45] Date of Patent: Jan. 14, 1992

[54] CERAMIC PACKAGE FOR SEMICONDUCTOR DEVICE

[75] Inventors: Noboru Sakaguchi; Shinichi Wakabayashi; Yoshiro Nishiyama; Kunihiko Imai; Yoshikazu Hirabayashi, all of Nagano, Japan

[73] Assignee: Shinko Electric Industries Co., Ltd., Nagano, Japan

[21] Appl. No.: 576,666

[22] Filed: Aug. 31, 1990

[30] Foreign Application Priority Data

Sep. 4, 1989 [JP] Japan .................................. 1-228691

[51] Int. Cl.$^5$ ............................................ B32B 15/04
[52] U.S. Cl. .................................. 428/610; 428/620; 428/621; 428/668; 428/680; 428/626
[58] Field of Search ............... 428/610, 620, 621, 622, 428/626, 627, 632, 633, 941, 641, 672, 680, 668, 665; 228/123, 124

[56] References Cited

U.S. PATENT DOCUMENTS

| | | | |
|---|---|---|---|
| 3,977,840 | 8/1976 | Estep et al. | 428/632 |
| 4,465,742 | 8/1984 | Nagashima et al. | 428/621 |
| 4,601,424 | 7/1986 | Adwalpalker et al. | 228/124 |

FOREIGN PATENT DOCUMENTS

| | | | |
|---|---|---|---|
| 53-53551 | 5/1978 | Japan | 228/124 |
| 57-72770 | 5/1982 | Japan | 228/124 |

*Primary Examiner*—John J. Zimmerman
*Attorney, Agent, or Firm*—Michael N. Meller

[57] ABSTRACT

A ceramic package used for a semiconductor device comprises a ceramic base including a die-bonding area and wire-bonding areas defined. A metal underlayer formed on the die-bonding or wire-bonding areas essentially consists of two-plated layers of: a cobalt layer plated on the ceramic base and a nickel layer plated on the cobalt layer. The underlayer is annealed and, them, a gold-plated layer is formed on the underlayer.

7 Claims, 1 Drawing Sheet

5,080,980

CERAMIC PACKAGE FOR SEMICONDUCTOR DEVICE

BACKGROUND OF THE INVENTION

1. Field of the Invention

This invention relates to a ceramic package, and more particularly, to such a ceramic package comprising a ceramic base and an improved electroplated metal underlayer formed on the ceramic base.

2. Description of the Related Art

A ceramic package used for a semiconductor device, known in the prior art, comprises a ceramic base having a die-bonding area and wire-bonding areas, and metal layers formed on the die-bonding area and wire-bonding areas of the ceramic base. Such metal layers on the ceramic base are usually made by:

- forming on the ceramic base with a metallized layer consisting of tungsten or the like,
- usually electroless plating with nickel,
- brazing metal leads to the metallized layer on the ceramic base,
- electroplating the underlayer with nickel as a surface treatment, and
- also electroplating the upper layer with gold.

The nickel-plated layer on the metallized layer is effective for obtaining a good property for brazing the metal leads. The nickel and gold-plated layers, which are provided after the leads are brazed, are effective for obtaining good bonding characteristics or endurable performance in its environments.

Generally speaking, a ceramic package has been used as a highly reliable package for a semiconductor device. However, in a ceramic package having an underlayer as imprising a nickel-plated layer, as mentioned above, there has been some problems in that a semiconductor chip might be peeled off when the package is subjected to an ageing process after die-bonding, or nickel might be diffused to the surface of the gold-plated layer to change a color of the surface of the gold-plated layer when package is heated. Also, in the recent years, semiconductor devices are sometimes used in relatively severe conditions. Thus, the above-mentioned characteristics and other conditions, for instance, a good soldering characteristic, are more strongly required.

Particularly important is a moisture endurability in the metal layers on the ceramic base and thus a ceramic package having a high moisture endurability is required, since the metal layers might become rusty in a moisture environment, giving rise to problems, such as an electric short circuit between conductive patterns.

In the prior art, to overcome the above-mentioned problems, Japanese Unexamined Patent Publication (Kokai) No. 59-155950 suggests that a cobalt-plated layer is used as an underlayer, Japanese Examined Patent Publication (Kokoku) No. 63-3036 suggests that a cobalt-nickel alloy is applied as an underlayer, and also Unexamined Patent Publication (Kokai) No. 63-83291 suggests that an alloy of cobalt, sulfur, and nickel is used as an underlayer to overcome the above-mentioned problems.

However, if a cobalt-plated layer were used as an underlayer, the cobalt might readily be oxidized to reduce the anti-corrosion characteristic and, therefore, the color of the package might readily be changed.

In a ceramic package, in which cobalt-nickel alloy is used as an underlayer, if the cobalt ratio in the alloy were low, the die bondability would poor and also discoloration of the upper gold-plated layer might be occur depending on the die bonding temperature. On the other hand, if the cobalt ratio in alloy were high, the discoloration characteristic and corrosion resistance would be deteriorated.

Also, as compared with an underlayer of nickel or cobalt only, an underlayer of cobalt-nickel alloy is disadvantageous in uniformness of the electroplated film thickness, because the throwing power of the alloy plating bath is poorer than that of the nickel or cobalt plating bath. Controling the plating bath is also difficult to preserve a certain quality and compositions thereof.

SUMMARY OF THE INVENTION

An object of the present invention is to provide a highly reliable ceramic package in which, during a process for manufacturing thereof, the die-bonding characteristic or the resistance to discoloration would be reduced by a heating process or an ageing process after a semiconductor die was mounted, and would not become rusty even in a wet environment.

According to the present invention, there is provided a ceramic package used for a semiconductor device comprising a ceramic base and metal layers formed on the ceramic base, the metal layers consisting essentially of two plated layers of: a cobalt layer plated on the ceramic base which may or may not have a metal layer for lead brazing and a nickel layer plated on the cobalt layer, and the two plated layers being annealed.

According to another aspect of the present invention, there is provided a ceramic package used for a semiconductor device comprising: a ceramic base, the ceramic base including at least one die-bonding area and a plurality of wire-bonding areas defined thereon; a metal underlayer formed on at least one of the die-bonding or wire-bonding areas of the ceramic base, the underlayer essentially consisting of two plated layers of: a cobalt layer plated on the ceramic base which may or may not have a metal layer for lead brazing and a nickel layer plated on the cobalt layer, and the underlayer being obtained by annealing the two plated layers; and a gold layer plated on the metal underlayer.

In this invention, a reliable ceramic package having good die-bonding and wire-bonding properties can be obtained. Also, in a ceramic package thus obtained, various conditions can be satisfied. For instance, a color of the gold-plated layer is not easily changed, and also the required heatproof, moistureproof and soldering characteristics of the metal underlayer are satisfied.

DESCRIPTION OF THE PREFERRED EMBODIMENTS

Figure 1:
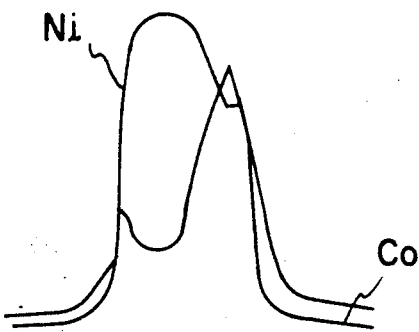
FIG. 1 shows density profiles of an underlayer of a ceramic package molded in a mold resin after separate layers of cobalt and nickel are plated and annealed in accordance with the present invention.
Figure 1:
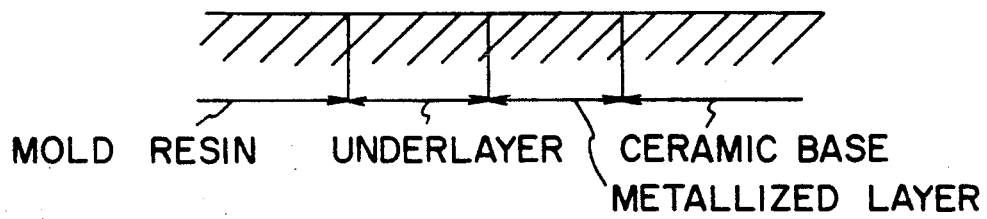

The drawings included in this application show the cross-sections of the ceramic package line-analyzed by an Electron Probe Micro Analyzer. Such a ceramic package is made by forming a plated layer (Co, Ni) on a ceramic base and annealed. The package is then molded in a mold resin.

A ceramic package according to the present invention comprises a die-bonding area or wire-bonding areas, or conductive patterns having metal layers which are obtained as follows. First, a cobalt electroplated layer is formed on a ceramic base, which may already have a nickel layer for lead brazing and, then, is electroplated with nickel to get two electroplated layers. Then, the ceramic body with such two layers is annealed.

To form such electroplated two layers, in a first step, a metallized layer consisting of, for example, tungsten(W) is formed on a ceramic base, in a second step, the ceramic base is plated with nickel and brazing metal leads to the ceramic base in a third step the ceramic base is electroplated with cobalt and, then, it is electroplated with nickel. In a fifth step, the ceramic base is annealed in an environment of vacuum, neutral, or reductive, at a temperature of 400° C.–780° C., preferably, 700° C.–750° C., and further electroplated with gold.

In case of connecting leads, such leads are connected by silver-Braze or something like that to the previously nickel plated metallized layer on the ceramic base, which is later electroplated with cobalt. Thus, after that, nickel is electroplated on the cobalt electroplated layer, and the ceramic base is annealed and then electroplated with gold.

As mentioned above, the ceramic base with the two electroplated metal layers comprising cobalt and nickel as an electroplated underlayer for gold is annealed according to the present invention. The results are that, compared with a conventionally known ceramic package having a nickel electroplated layer or nickel-cobalt alloy electroplated layer as an underlayer, a ceramic package obtained according to the present invention has good properties, as mentioned in detail hereinafter.

It is deemed that the reasons why the package obtained according to the present invention has such good properties by annealing the two layers in a non-oxidation environment are as follows. The material used for metallizing, i.e., tungsten, will not melt due to a difference in voltage for melting between the metallized layer and the metal-plated layer, and plated cobalt is diffused into nickel when the two-layered underlayer is annealed.

The following table shows the work functions of tungsten (W) used as a metallized layer, silver (Ag) and copper (Cu) used as a material for a brazing process, and cobalt (Co), nickel (Ni), and gold (Au) used as a plated metal.

| Co: 4.25 eV | W: 4.35 eV  | Cu: 4.48 eV |
| Ag: 4.70 eV | Au: 4.71 eV | Ni: 4.91 eV |

Comparing these work functions, it is noted that the value for cobalt is the lowest and the next lowest is tungsten.

In a steam age test using a ceramic package having electroplated nickel as an underlayer, the boundary of the metal layers becomes rusty, and the rust contains tungsten, silver, and copper. The work functions of these components are all lower than that of the nickel and, therefore, easily dissolved at the boundary of the metal layers. In the prior art, it has been understood that such rust is derived from dissolved tungsten and nickel etc.

However, according to the present invention, cobalt is electroplated as an underlayer for gold on the ceramic package and the work function of cobalt is lower than that of tungsten. Therefore, it is understood that tungsten or the like is prevented from melting at the boundary of the metal layers and, therefore, the cobalt layer is prevented from becoming rusty.

If the cobalt layer and the nickel layer were plated reversely up and down, nickel could exist at the boundary of the tungsten metallized layer, it could be deemed that where the effects for preventing dissolving would be reduced, as compared with the case that cobalt exists at the same boundary.

FIG. 1 shows the results of measurements for an embodiment of this invention, i.e., density profiles of the cross section of cobalt (Co) and nickel (Ni) in the metal underlayer of the ceramic package, in which the above-mentioned two layers are electroplated on the ceramic base and then annealed. The thickness of the electroplated cobalt layer was 1 $\mu$ and the thickness of the electroplated nickel layer was 2 $\mu$. As the results, a part of the cobalt underlayer was dispersed into the nickel upper layer and the diffused cobalt was localized to the surface areas of the nickel layer.

Figure 2:
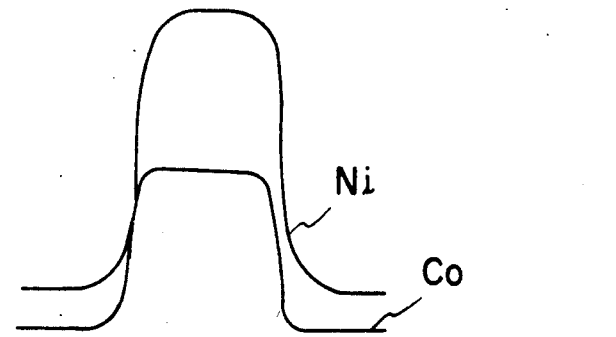
FIG. 2 shows density profiles of an underlayer of a ceramic package molded in a mold resin after a cobalt-nickel alloy is plated in accordance with conventional arrangements.
Figure 2:
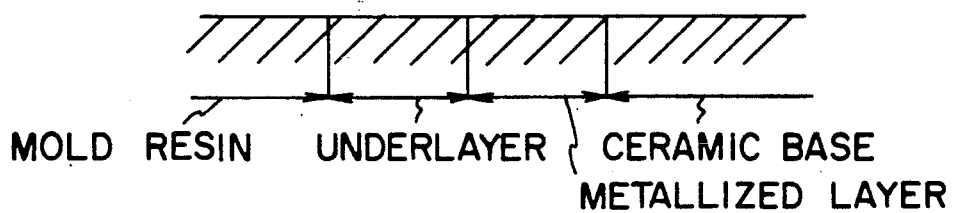

FIG. 2 shows the results of measurements for a comparative example, i.e., density profiles of the cross section of cobalt (Co) and nickel (Ni) in the metal underlayer of the ceramic package, in which a cobalt-nickel alloy electroplated layer is used as an underlayer. In this example, it should be noted that cobalt was not localized on the surface area of the nickel layer. The cobalt and nickel layers are relatively evenly distributed in the electroplated layer.

As mentioned above, if a two-layered underlayer is annealed, cobalt locally existing on the surface of the nickel layer prevents nickel from diffusing into the gold electroplated layer and also prevents a semiconductor die from peeling off from the package. Also, discoloring of the gold-plated layer is prevented.

Also, since the concentration of nickel under the localized cobalt layer in the annealed nickel-cobalt layer is relatively high, the nickel greatly contributes to the heat endurable property of the under layer itself and prevents underlayer from changing the color and, therefore, a heat endurable and anticorrosive ceramic package can be obtained according to the present invention.

EXPERIMENT I

A comparative test for moisture endurability or the like was carried out for the following five samples (a)–(e).

a: Ni-Co alloy plating (rate of Co: 11%)
b: Ni/Co plating (thickness of Co: 0.15–0.25 $\mu$)
c: Ni/Co plating (thickness of Co: 0.9–1.0 $\mu$)
d: Ni/Ni-Co alloy plating (rate of Co in Ni-Co alloy: 80%, rate of Co in whole: 20%)
e: Ni The samples (a) and (e) concern a single electroplated layer of Ni-Co alloy or nickel. The samples (b) and (c) both concern two layers of electroplated nickel and cobalt, having different thicknesses of the plated layers. The sample (d) concerns two layers of electroplated nickel, and Ni-Co alloy in place of cobalt.

These samples were made as follows. Ceramic bases were first prepared and a tungsten metallized layer was plated with nickel and leads were attached to the ceramic body. Then, for the samples (b) and (c) cobalt was first electroplated on the tungsten metallized layer and, then, nickel was also electroplated. Then, the samples were annealed in a reduction environment and, thereafter, the samples were electroplated with gold.

(1) Test for wire-bonding characteristics

In a wire-bonding process, wires were connected to the metal layer of each sample. Then, each sample was subjected to an ageing process at 200° C. Then, the wires were pulled to check whether the wires were peeled off or not. Table 1 represents the results of this test for the wire-bonding characteristics. The left column represents the ageing time (hours). 0/5 means no NG sample per five test samples.

TABLE 1

| hour | Wire-Bonding Characteristics | | | | |
|------|---|---|---|---|---|
| | a | b | c | d | e |
| 50 H | 0/5 | 0/5 | 0/5 | 0/5 | 0/5 |
| 100 | 0/5 | 0/5 | 0/5 | 0/5 | 0/5 |
| 200 | 0/5 | 0/5 | 0/5 | 0/5 | 0/5 |
| 300 | 0/5 | 0/5 | 0/5 | 0/5 | 0/5 |

For the respective samples, there were no problems for wire-bonding characteristics. In other words, there were no samples whose bonded wire peeled off.

(2) Test for die-bonding characteristics

A semiconductor chip was mounted and fixed on each sample by means of a gold-silicon eutectic alloy. Then, each sample was subjected to an ageing process at 300° C. Then, the semiconductor chip was subjected to a load to check whether the semiconductor chip was peeled off or not. Table 2 represents the results of this test for the die-bonding properties.

TABLE 2

| hour | Die-Bonding Properties | | | | |
|------|---|---|---|---|---|
| | a | b | c | d | e |
| 30 H | 0/5 | 0/5 | 0/5 | 0/5 | 0/5 |
| 50 | 0/5 | 0/5 | 0/5 | 0/5 | 0/5 |
| 100 | 0/5 | 0/5 | 0/5 | 0/5 | *3/5 |
| 200 | 0/5 | 0/5 | 0/5 | 0/5 | *5/5 |

As understood in Table 2, some semiconductor chips were peeled off for the samples (e) (Ni-plated underlayer), in which the ageing process was over 100 hours. Hereinafter, the mark * indicates that there were some NG samples.

(3) Test for heat endurable characteristics

Each sample was heated at 450° C. in atmospheric environments for five minutes. Then, after 10 minutes had expired, each sample was checked whether the color thereof was changed or not. Table 3 represents the results of this heat test.

TABLE 3

| time | Heat Endurable Properties | | | | |
|------|---|---|---|---|---|
| | a | b | c | d | e |
| 5 min | 0/5 | 0/5 | 0/5 | 0/5 | 0/5 |
| 10 | 0/5 | 0/5 | 0/5 | 0/5 | 0/5 |

There were no particular problems for the respective samples. However, the electroplated layers of the samples (a) (N-Co alloy plating) represented as a whole a little bit red-brown color as compared with the other samples.

(4) Test for soldering properties

Each sample was exposed in steam a for predetermined of hours, as indicated in Table 4. Then, each sample was subjected to a solder-dipping process and checked whether the soldered layer was well coated on the sample or not.

TABLE 4

| hour | Soldering Properties | | | | |
|------|---|---|---|---|---|
| | a | b | c | d | e |
| 8 H | 0/5 | 0/5 | 0/5 | 0/5 | 0/5 |
| 16 | 0/5 | 0/5 | 0/5 | 0/5 | *1/5 |
| 32 | 0/5 | 0/5 | 0/5 | 0/5 | 0/5 |

There were no particular differences between samples. However, the soldering properties for only one sample in the samples (e) were unacceptable.

(5) Test for humidity endurable characteristics

Each sample was preserved in an environment of a temperature of 85° C. and a moisture of 85%. Each sample was checked whether the respective metal layers were corroded or not, or had became rusty or not.

TABLE 5

| hour | Humidity Endurable Characteristics | | | | |
|------|---|---|---|---|---|
| | a | b | c | d | e |
| 580 | 0/5 | 0/5 | 0/5 | 0/5 | *5/5 |
| 1120 | *2/5 | 0/5 | 0/5 | 0/5 | *5/5 |
| 1480 | *4/5 | 0/5 | 0/5 | *1/5 | *5/5 |
| 2100 | *4/5 | 0/5 | 0/5 | *2/5 | *5/5 |

In Table 5, the unit of time is hours. Except for the samples (b) and (c), the samples (a), (d) and (e) became rusty. Regarding the rate of samples which became rusty, the samples (e) (Ni-underlayer) were the highest, next the samples (a) (Ni-Co underlayer) and the samples (d) (Ni/Ni-Co alloy underlayer).

According to the present experiments, it was noted that the samples (b) and (c) were the most favorable in the various aspects to satisfy all of the above-mentioned conditions.

In the samples (b) and (c), an additional test was carried out, in which the electroplated layers were reversed up and down. In other words, nickel was first electroplated on the metallized layer and, then, cobalt was electroplated on the nickel. In this case, similar properties as those of the above-mentioned examples (b) and (c) could not be obtained.

EXPERIMENT II

A comparative test was carried out in which the thicknesses of the nickel and cobalt electroplated underlayers were changed. In these experiments, several samples were prepared in which the total thickness of the nickel and cobalt layers was 3 μ. Each sample was annealed at 750° C. in a non-oxidation environment and, then, electroplated with gold whose thickness was 1.5 μ.

In Table 6, ⑥ represents the results of die-bonding properties; ⑦, heat endurable properties of a plated-gold layer; and ⑧, heat endurable properties of the electroplated underlayer.

In the test for ⑥ die-bonding characteristics, after a semiconductor chip was mounted and fixed on the sample, it was subjected to an ageing process at 300° C. for 60 hours. Then, the sample was pulled to check whether the semiconductor chip was peeled off or not.

In the test for ⑦ heat endurable characteristics of electroplated gold layer, each sample was heated at 450° C. in atmospheric environments for five minutes and, then, each sample was checked whether the color thereof had changed or not. In the test for ⑧ heat endurable characteristics of the electroplated underlayer, each sample which had no gold-plated layer was heated at 400° C. in on atmospheric environment for one minutes and, then, each sample was checked whether the color thereof has changed or not. The numbers of samples used in this experiment were 20 for each sample 1–13.

TABLE 6

(Rate of Thickness was Changed)

| Samples | Rate of Thickness (%) | | Comparative test | | |
|---|---|---|---|---|---|
| | Co | Ni | ⑥ | ⑦ | ⑧ |
| 1 | 100 | — | 0 | 0 | *20 |
| 2 | 98 | 2 | 0 | 0 | *13 |
| 3 | 96 | 4 | 0 | 0 | *1 |
| 4 | 94 | 6 | 0 | 0 | 0 |
| 5 | 90 | 10 | 0 | 0 | 0 |
| 6 | 75 | 25 | 0 | 0 | 0 |
| 7 | 50 | 50 | 0 | 0 | 0 |
| 8 | 25 | 75 | 0 | 0 | 0 |
| 9 | 10 | 90 | 0 | 0 | 0 |
| 10 | 6 | 94 | 0 | 0 | 0 |
| 11 | 4 | 96 | 0 | 0 | 0 |
| 12 | 2 | 98 | *5 | *2 | 0 |
| 13 | — | 100 | *17 | *8 | 0 |

In Table 6, the sample 1 had an underlayer of cobalt, the percentage of thickness thereof was 100% and, on the other hand, the sample 13 had an underlayer of nickel, the percentage of thickness thereof was also 100%. According to these experimental results, it can be understood that the cobalt-plated layer was superior in the test for ⑥ die-bonding characteristics and the test for ⑦ heat endurable characteristics of the plated-gold layer, and inferior in the test for ⑧ heat endurable characteristics of the electroplated underlayer.

Table 7 represents experimental results for comparative examples, in which the nickel-cobalt alloy layer was electroplated on the ceramic base as an underlayer. The respective samples are different in composition. The number of the samples used in this experiment was also 20 for each sample 14–22.

TABLE 7

(Ni—Co composition was Changed)

| Samples | Rate of Thickness (%) | | Comparative test | | |
|---|---|---|---|---|---|
| | Co | Ni | ⑥ | ⑦ | ⑧ |
| 14 | 52.6 | 47.4 | 0 | 0 | *20 |
| 15 | 45.3 | 54.7 | 0 | 0 | *20 |
| 16 | 32.4 | 67.6 | 0 | 0 | *20 |
| 17 | 23.4 | 76.6 | 0 | 0 | *19 |
| 18 | 13.9 | 86.1 | 0 | 0 | *10 |
| 19 | 7.7 | 92.3 | 0 | 0 | *3 |
| 20 | 4.8 | 95.2 | *4 | *1 | *1 |
| 21 | 2.7 | 97.3 | *13 | *5 | 0 |
| 22 | 1.1 | 98.9 | *20 | *9 | 0 |

From the results in Tables 6 and 7, it is understood that an underlayer consisting of two metal layers of electroplated cobalt and nickel layers and annealed is very effective as an underlayer of a gold-plated layer. Particularly, each of the samples 4–11 (the thickness percentage of the cobalt layer was 4–94%) has sufficiently good characteristics. It has been found that the samples are practically effective if the thickness of the cobalt is 0.12–5 μ. Also, the underlayer consisting electroplated cobalt and nickel layers has favorable heat endurable characteristics, particularly less color changeable effects.

Therefore, a gold-plated layer can only be applied to the necessary portions, such as wire-bonding areas, a die-bonding area, or seal frame portion, and the like. Thus, on some other portions, such as outer leads, the annealed underlayer consisting of electroplated cobalt and nickel layers can be exposed.

It should be understood by those skilled in the art that the foregoing description relates to only a preferred embodiment of the disclosed invention and that various changes and modifications may be made in the invention without departing from the spirit and scope thereof.

We claim:

1. A ceramic package used for a semiconductor device comprising a ceramic base and a metal layer formed on said ceramic base as an electrically conductive metallized layer, said metal layer consisting essentially of a cobalt layer plated on said ceramic base and a nickel layer plated on said cobalt layer, wherein said cobalt and nickel layers are annealed so that the cobalt layer is diffused into the nickel layer.

2. A ceramic package as claimed in claim 1, wherein a thickness of said cobalt layer is 0.12–5 μm.

3. A ceramic package used for a semiconductor device comprising:

a ceramic base, said ceramic base including at least one die-bonding and one wire-bonding areas defined thereon;

a metal underlayer formed on at least one of said die-bonding or wire-bonding areas of said ceramic base as an electrically conductive metallized layer, said underlayer essentially consisting of a cobalt layer plated on said ceramic base and a nickel layer plated on said cobalt layer, and said underlayer being obtained by annealing said cobalt and nickel layers so that the cobalt layer is diffused into the nickel layer; and a gold layer plated on said metal underlayer.

4. A ceramic package as claimed in claim 3, wherein a thickness of said cobalt layer 0.12–5.0 μm.

5. A ceramic package used for a semiconductor device comprising:

a ceramic base, said ceramic base including at least one die-bonding area and one wire-bonding areas defined thereon;

an electrically conducting metallized layer formed on at least one of said die-bonding or wire-bonding areas of said ceramic base, a metal underlayer formed on said metallized layer, said underlayer essentially consisting of a cobalt layer plated on said ceramic base and a nickel layer plated on said cobalt layer, and said underlayer being obtained by annealing said cobalt and nickel layers so that the cobalt layer is diffused into the nickel layer;

a gold layer plated on said metal underlayer.

6. A ceramic package as claimed in claim 5, wherein metallized layer essentially consists of tungsten.

7. A ceramic package as claimed in claim 5, wherein a thickness of said cobalt layer is 0.12–5.0 μm.

* * * * *